United States Patent [19]

Manyoki et al.

[11] Patent Number: 6,069,486

[45] Date of Patent: May 30, 2000

[54] CIRCUIT CONFIGURATION FOR REDUCING DISTURBANCES DUE TO A SWITCHING OF AN OUTPUT DRIVER

[75] Inventors: Zoltan Manyoki; Christian Sichert; Ralf Schneider, all of München; Rainer Bartenschlager, Kaufbeuren, all of Germany

[73] Assignee: Siemens Aktiengesellschaft, Munich, Germany

[21] Appl. No.: 09/160,851

[22] Filed: Sep. 25, 1998

[30] Foreign Application Priority Data

Sep. 30, 1997 [DE] Germany ................. 197 43 284

[51] Int. Cl.[7] .................................................. H03K 17/16
[52] U.S. Cl. ............................. 326/27; 326/87; 326/83
[58] Field of Search ............................ 326/33, 34, 83, 326/86, 87, 26, 27

[56] References Cited

U.S. PATENT DOCUMENTS 5,329,175  7/1994  Peterson ........................... 326/87
5,424,653  6/1995  Folmsbee et al. ................. 326/26
5,781,050  7/1998  Russell ............................ 327/170

FOREIGN PATENT DOCUMENTS

4200680A1  7/1993  Germany .

OTHER PUBLICATIONS

"Digital MOS Integrated Circuits II", edited by Mohamed I. Elmasry, IEEE Solid–State Circuits Council, pp. 385–392.

*Primary Examiner*—Jon Santamauro
*Assistant Examiner*—Don Phu Le
*Attorney, Agent, or Firm*—Herbert L. Lerner; Laurence A. Greenberg; Werner H. Stemer

[57] ABSTRACT

A circuit configuration for reducing disturbances due to a switching of an output driver. The output driver has a plurality of output driver stages and a delay element. The delay element increases the signal delay of the switch-on or switch-off signals for the output driver stages with an increasing supply voltage.

4 Claims, 1 Drawing Sheet

CIRCUIT CONFIGURATION FOR REDUCING DISTURBANCES DUE TO A SWITCHING OF AN OUTPUT DRIVER

BACKGROUND OF THE INVENTION

FIELD OF THE INVENTION

The present invention relates to a circuit configuration for reducing disturbances caused by switching an output driver. The circuit configuration has individual output driver stages. A switching signal is supplied to the individual stages for switching the output driver on or off. The switching signal has a time delay between each of the individual stages, in order to switch the output driver stage by stage. Circuit configurations of this type are for instance described and shown in the German Published, Non-Prosecuted Patent Application DE 42 00 680 A1 or in the textbook "Digital MOS Integrated Circuits II," edited by Mohamed I. Elmasry, 1992, ISBN O-87942-275-0, on pages 385–92, and in particular in FIG. 5 on page 388.

Digital semiconductor components with a large number of outputs, such as 16 or more outputs, have a considerable disturbance in the supply voltage when the output driver stages at the respective outputs are switched simultaneously. This phenomenon is generally known, inter alia, as "dI/dt noise", "groundbounce", "simultaneous switching noise", etc. Switching large currents on or off results in an increased disturbance.

When a plurality of output driver stages are switched simultaneously, the disturbance acting on the supply voltage increases with an increasing supply voltage, since switching large output currents requires a high supply voltage.

In order to reduce supply voltage disturbances caused by simultaneous switching, it has been suggested to provide a circuit arrangement with output driver stages connected in parallel, wherein the output driver stages are switched in a time delayed manner rather than being switched simultaneously. The current changes caused by the parasitic inductances of the digital semiconductor components are reduced by this temporally delayed or staggered switching of the individual output driver stages connected in parallel with one another.

FIG. 3 shows such a circuit configuration with output driver stages 1, 2, which are driven via an input terminal 3 and which are connected in parallel to an output terminal 4. The output driver stages 1, 2 are driven such that at first the output driver stage 1 is driven and then, with a delay, the output driver stage 2. The delay is effected by a delay element 5. The delay element 5 operates such that the resulting time delay decreases with an increasing supply voltage VCC.

Switching the individual output drivers time-delayed with respect to one another is advantageous in reducing the above-mentioned disturbances of the supply voltage. However, this advantage is at the expense of the total signal delay of such a circuit configuration which increases as a result of the time delayed switching on of the individual output driver stages. This undesirable effect is most prominent when the time delay between switching on the individual output driver stages is longest, that is to say when the supply voltage is low. This is due to the fact that in the conventional circuit configurations, which use common output drivers, the signal delay increases with a decreasing supply voltage. In other words, the higher the supply voltage the shorter the time delay between the individual output driver stages. This means that the disturbance reduction is smallest at a high supply voltage, just when most of the disturbances occur. This is the reason why conventional circuit configurations for reducing disturbances caused by switching an output driver operate inadequately, in particular with high supply voltages when the reduction of disturbances is reduced by the diminishing time delay between the output driver stages.

SUMMARY OF THE INVENTION

It is accordingly an object of the invention to provide a circuit configuration for reducing disturbances caused by switching an output driver which overcomes the above-mentioned disadvantages of the heretofore-known circuit configurations of this general type and according to which, a reliable disturbance reduction is accomplished even with high supply voltages.

With the foregoing and other objects in view there is provided, in accordance with the invention, a circuit configuration for reducing disturbances due to a switching of an output driver. The circuit configuration comprises an output driver having at least a first output driver stage and a second output driver stage, the first output driver stage and the second output driver stage receiving a switching signal for selectively switching on and off the output driver, the second output driver stage receiving the switching signal with a time delay relative to the first output driver stage, the time delay being greater the greater the supply voltage.

The circuit configuration according to the invention increases a delay of a switch-on signal for the output driver with an increasing supply voltage for reducing disturbances caused by switching the output driver. In other words, in the circuit configuration according to the invention, the signal delay of the switch-on signal is increased with an increasing supply voltage.

For the circuit configuration according to the invention, it is essential that the delay between the switching on or switching off of the individual output driver stages is increased with a rising supply voltage. Therefore, disturbances are reduced only when this is actually necessary, namely when supply voltages are increased. In the "worst case", that is when the supply voltage is very high and thus the disturbances are increased, the delay is longest, which in turn reduces the disturbances the most.

In accordance with a further feature of the invention, the output driver stages have control inputs, and the circuit configuration includes a delay element connected between the control inputs of the output driver stages.

In accordance with another feature of the invention, the delay element has a CMOS inverter and a constant-current source connected in series with the CMOS inverter.

In accordance with yet another feature of the invention, the constant-current source has a transistor.

The delay circuit which increasingly delays switch-on signals or switch-off signals, supplied to the output driver stages, with an increasing supply voltage, can be designed in a variety of ways. One exemplary embodiment uses a conventional CMOS inverter with a current source as delay circuit. In this case the current source limits the so-called "pull-down" current of the inverter, with the result that as the supply voltage increases, the output driver stage connected downstream is switched on or off with a delay.

Other features which are considered as characteristic for the invention are set forth in the appended claims.

Although the invention is illustrated and described herein as embodied in a circuit configuration for reducing disturbances due to a switching of an output driver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
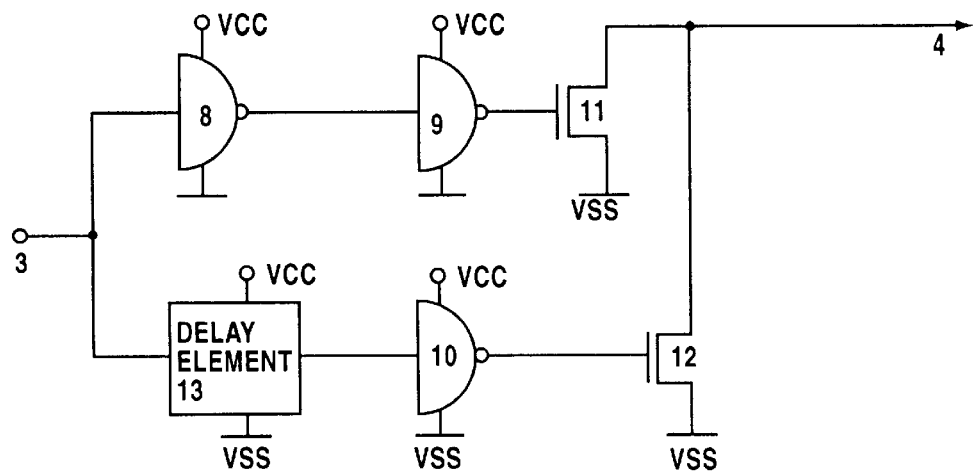
FIG. 1 shows a circuit configuration of an exemplary embodiment of the invention.

In the figures, the same reference numbers indicate corresponding components. FIG. 1 shows an exemplary embodiment of the circuit configuration in accordance with the invention. An output driver stage 11 formed of an N-channel MOS transistor is connected downstream of an input terminal 3 via inverters 8, 9 and an output driver stage 12 likewise comprising an N-channel MOS transistor is connected downstream of the input terminal via a delay element 13 and an inverter 10. The inverters 8, 9 and 10 and the delay element 13 are therefore connected between the supply voltage VCC and a reference voltage VSS.

Figure 3:
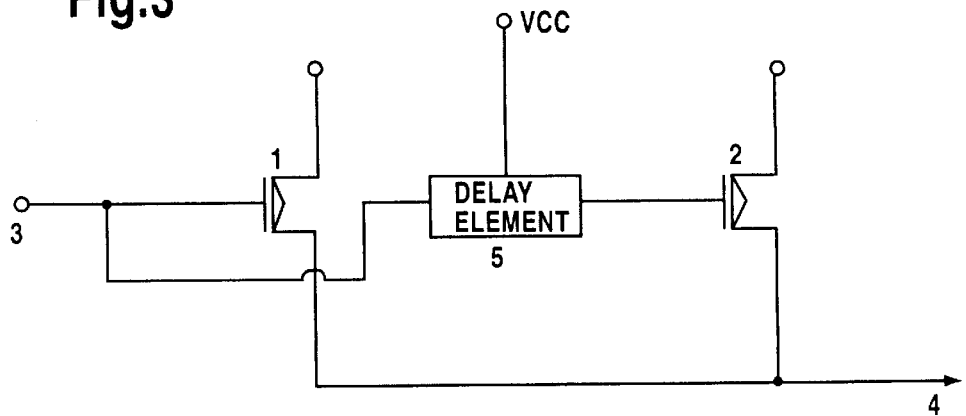
FIG. 3 is a basic circuit diagram with two output driver stages and a known delay circuit, which is explained in the discussion of the background of the invention.

Unlike the delay element 5 of the existing circuit configuration (cf. FIG. 3), the delay element 13 operates such that the delay increases with an increasing supply voltage.

In contrast to the prior art, the circuit configuration according to the invention has the delay element 13, which increases the delay when a supply voltage VCC is increased. In other words, the higher the supply voltage VCC the longer the time delay between the switching on and switching off of the output driver stages 11 and 12.

Figure 2:
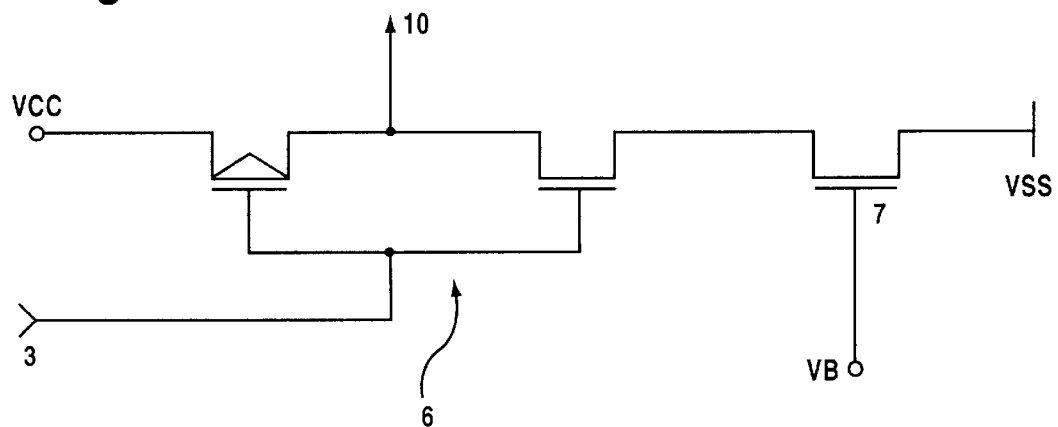
FIG. 2 shows an exemplary embodiment of a delay circuit.

FIG. 2 illustrates an exemplary embodiment of the delay element 13. In this exemplary embodiment, the delay element 13 comprises a CMOS inverter 6 and, connected in series therewith, a constant-current source formed by a transistor 7. The constant-current source limits the "pull-down" current of the CMOS inverter 6, with the result that in this case the delay obtained between the input and the output increases with a rising supply voltage VCC. A supply voltage VB at the gate of the transistor 7 serves to set the desired delay.

We claim:

1. A circuit configuration for reducing disturbances due to a switching of an output driver, the circuit configuration comprising:

an output driver having at least a first output driver stage and a second output driver stage, said first output driver stage and said second output driver stage receiving a switching signal for selectively switching on and off said output driver, said second output driver stage receiving the switching signal with a time delay relative to said first output driver stage, the time delay increasing with an increase in a supply voltage.

2. The circuit configuration according to claim 1, wherein said output driver stages have control inputs, and including a delay element connected between said control inputs of said output driver stages.

3. The circuit configuration according to claim 2, wherein said delay element has a CMOS inverter and a constant-current source connected in series with said CMOS inverter.

4. The circuit configuration according to claim 3, wherein said constant-current source has a transistor.

* * * * *